US010921268B1

(12) United States Patent
Hendriksen et al.

(10) Patent No.: US 10,921,268 B1
(45) Date of Patent: Feb. 16, 2021

(54) METHODS AND DEVICES FOR PREPARING SAMPLE FOR CRYOGENIC ELECTRON MICROSCOPY

(71) Applicant: FEI Company, Hillsboro, OR (US)

(72) Inventors: Bas Hendriksen, Eindhoven (NL); Maarten Kuijper, Eindhoven (NL); Luigi Mele, Eindhoven (NL); Pleun Dona, Eindhoven (NL); Erum Raja, Rockford, IL (US); Atieh Aminian, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/565,058

(22) Filed: Sep. 9, 2019

(51) Int. Cl.
  *G01N 23/225* (2018.01)
  *G01N 1/42* (2006.01)
  *G01N 23/2204* (2018.01)

(52) U.S. Cl.
  CPC ............ *G01N 23/225* (2013.01); *G01N 1/42* (2013.01); *G01N 23/2204* (2013.01); *H01J 2237/221* (2013.01)

(58) Field of Classification Search
  CPC .............. H01J 37/26; H01J 2237/2003; H01J 2237/2002; H01J 2237/2802; G01N 23/2251; G01N 23/2204; G01N 1/42; G01N 23/02; G01N 27/44791; G01N 2021/0346; G01N 2223/418; G01N 2021/058; G01N 30/6095
  USPC ................... 250/307, 311, 385.1, 440.11
  See application file for complete search history.

(56) References Cited

U.S. PATENT DOCUMENTS

| 5,672,878 | A * | 9/1997 | Yao ............. G01T 1/185 250/385.1 |
| 9,162,211 | B2 * | 10/2015 | Van Veen ........... B01J 19/0093 |
| 9,741,529 | B2 | 8/2017 | Mele et al. |
| 9,786,469 | B2 * | 10/2017 | Wang ................. H01J 37/26 |
| 2008/0179518 | A1 * | 7/2008 | Creemer ............ H01J 37/26 250/311 |
| 2010/0193398 | A1 * | 8/2010 | Marsh ............... H01J 37/20 206/710 |
| 2012/0120226 | A1 * | 5/2012 | de Jonge ........... G01N 23/2251 348/80 |

(Continued)

FOREIGN PATENT DOCUMENTS

WO  2018106761  6/2018

OTHER PUBLICATIONS

Venkataraman Giridharan, Yeoheung Yun, Peter Hajdu, Laura Conforti, Boyce Collins, Yongseok Jang, and Jagannathan Sankar; Microfluidic Platforms for Evaluation of Nanobiomaterials: A Review; Journal of Nanomaterials; Apr. 19, 2012; vol. 2012, Article ID 789841; Hindawi Publishing Corporation.

(Continued)

*Primary Examiner* — David A Vanore

(57) ABSTRACT

Various methods and devices are provided for searching the optimum sample condition of a sample for cryogenic electron microscopy. Multiple samples with different sample conditions may be screened using a sample inspection device. The sample inspection device includes at least a chamber formed between a top electron transparent layer and a bottom electron transparent layer for holding the sample. Multiple pillars are arranged within the chamber. The sample inspection device includes a window covering at least one of the multiple pillars.

18 Claims, 10 Drawing Sheets

(56) References Cited

U.S. PATENT DOCUMENTS

| | | | | |
|---|---|---|---|---|
| 2013/0146221 A1* | 6/2013 | Kolmakov | ............ | H01J 37/252 |
| | | | | 156/252 |
| 2013/0264476 A1* | 10/2013 | Damiano, Jr. | .......... | H01J 37/29 |
| | | | | 250/307 |
| 2017/0032928 A1* | 2/2017 | Mele | ...................... | G01N 21/03 |
| 2017/0062177 A1* | 3/2017 | Walden, II | .............. | H01J 37/26 |
| 2017/0213691 A1* | 7/2017 | Dona | ...................... | H01J 37/20 |
| 2017/0213692 A1* | 7/2017 | Yu | .......................... | H01J 37/16 |
| 2017/0348687 A1* | 12/2017 | Liddle | .................... | H01J 37/20 |
| 2018/0266989 A1* | 9/2018 | Jungjohann | .............. | G01N 3/02 |

OTHER PUBLICATIONS

Dmitry Lyumkis; Challenges and Opportunities in Cryo-EM Single-Particle Analysis; Journal of Biological Chemistry; Feb. 25, 2019; JBC Papers in Press.

* cited by examiner

METHODS AND DEVICES FOR PREPARING SAMPLE FOR CRYOGENIC ELECTRON MICROSCOPY

FIELD OF THE INVENTION

The present description relates generally to methods and devices for preparing samples for single particle analysis, and more particularly, to optimizing the sample quality for single particle analysis based on cryogenic electron microscopy imaging.

BACKGROUND OF THE INVENTION

Single particle analysis based on cryogenic electron microscopy (cryo-EM) images may solve structures of biological macromolecules at near atomic resolution. Sample preparation is a key step for obtaining high quality cryo-EM images of the macromolecules. As an example, in order to solve protein structure, the protein sample is prepared by mixing the protein with one or more buffer solutions. The sample construct, as well as buffer conditions including PH level, salt concentration, surfactant concentration, and detergent concentration, need to be optimized to solubilize and stabilize the protein for the optimal cryo-EM result. However, preparing and imaging vitrified protein samples with different sample conditions requires extensive trial and error testing, and can become extremely time consuming.

SUMMARY

In one embodiment, a sample inspection device is used for screening the sample condition. The sample inspection device comprises one or more chambers formed between a top electron transparent layer and a bottom electron transparent layer for holding a first sample; multiple pillars within the first chamber, each pillar of the multiple pillars extends from the top electron transparent layer to the bottom electron transparent layer; and a window formed with a portion of at least one of the top electron transparent layer and the bottom electron transparent layer for inspecting the first sample in the first chamber, the window covering at least one of the multiple pillars. In this way, samples with multiple sample conditions may be vitrified and imaged within the same sample inspection device.

In another embodiment, a method for inspecting a sample using a sample inspection device comprises flowing a first sample into a first chamber of the sample inspection device, wherein the first chamber is formed between a top electron transparent layer and a bottom electron transparent layer, multiple pillars are arranged within the first chamber, and each pillar of the multiple pillars extends from the top electron transparent layer to the bottom electron transparent layer; directing a charged particle beam towards a window of the sample inspection device, wherein the window is formed with a portion of at least one of the top electron transparent layer and the bottom electron transparent layer, and the window covers at least one of the multiple pillars; and forming a first image of the first sample based on charged particles transmitted through the sample inspection device.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION OF EMBODIMENTS

Figure 1:
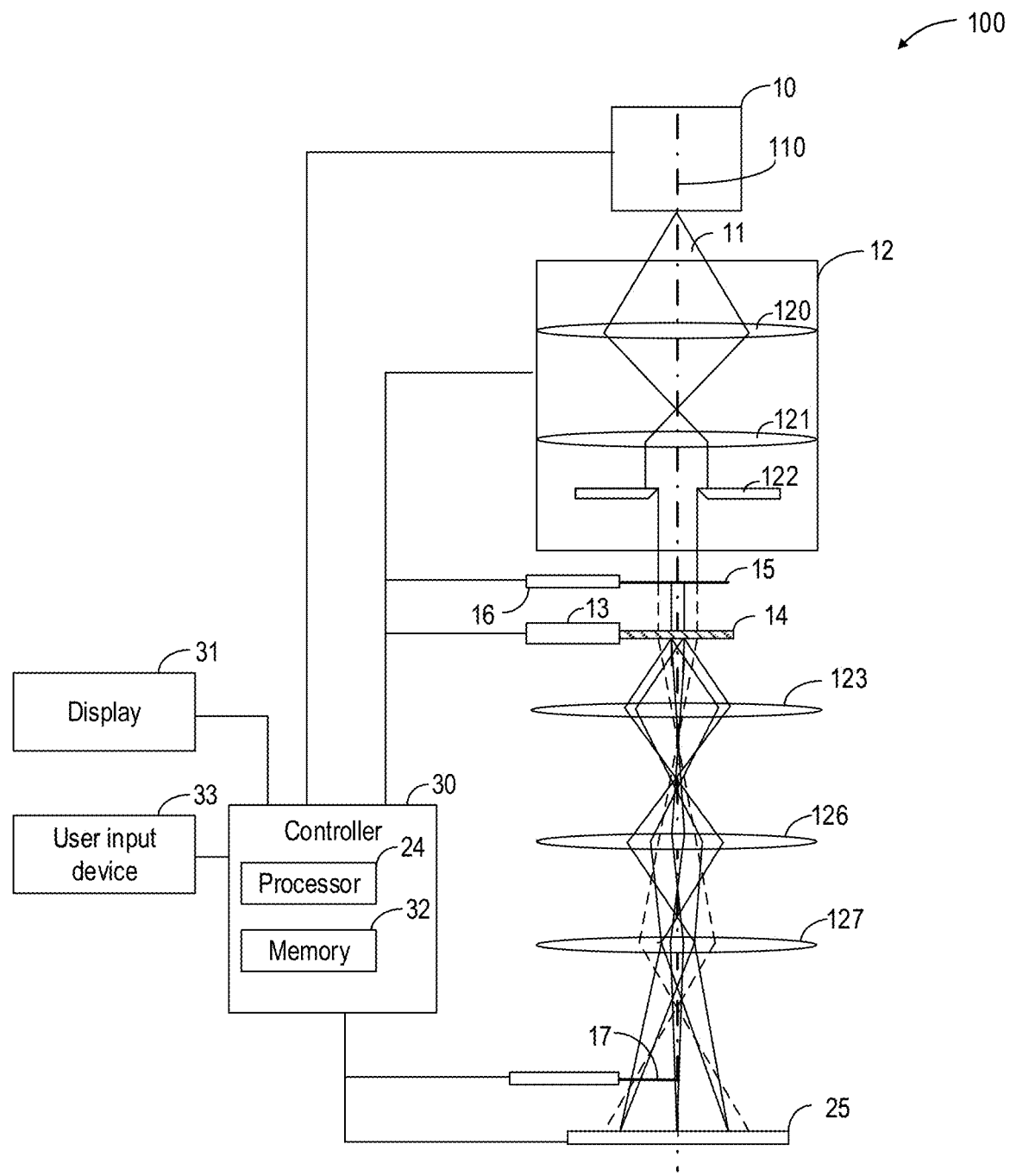
FIG. 1 illustrates a cryogenic electron microscopy system.

The following description relates to systems and methods for screening samples for cryogenic electron microscopy (cryo-EM) based single particle analysis. The cryo-EM imaging may be performed using an imaging system shown in FIG. 1.

In order to perform single particle analysis, the sample is undergone multiple sample preparation steps to achieve an optimal sample condition before being imaged with the cryo-EM imaging system. The sample condition may include buffer type and PH level, salt and detergent type and concentration, as well as surfactant concentration. The sample condition may also include nanodisc size, lipid to protein ratio, and critical micelle concentration.

The sample preparation steps may include purifying the sample, mixing the purified sample with buffers, and vitrifying the mixture. One of the sample preparation steps is mixing the sample, such as a protein, with one or more buffers to solubilize and stabilize the sample. For example, the protein maybe stabilized by adding constructs such as nanodisc, cross-linker, and or scaffolds. By mixing the sample with the one or more buffers, the buffer system of the sample is exchanged from the buffer system used during the purification process and/or sample storage to a buffer system suitable for cryo-EM imaging.

The sample quality for single particle analysis may be determined based on the cryo-EM images of the sample. The sample quality may include the particle quality, the sample-grid quality, and the cryo-EM image quality. The particle quality may include one or more of the tertiary and quaternary structure, aggregation state, stability, particle binding, particle size, and particle similarity. The sample-grid quality may include one or more of ice formation, and particle distribution and particle orientation on the grid. The image quality may include one or more of contrast and resolution.

Though multiple techniques are available for screening the sample for protein expression and purification without cryo-EM imaging, the sample quality for single particle analysis can only be accurately and reliably determined based on the cryo-EM image of the vitrified sample. As a result, the sample condition can only be accurately and reliably evaluated based on the cryo-EM images. Because it is difficult to predict the sample condition for a new sample based on known optimal sample conditions for other samples, multiple iterations of sample preparation and cryo-EM imaging have to be performed to search for the optimal sample condition for the new sample.

In order to address this issue, various examples of the sample inspection device and methods for screening the sample condition using the sample inspection device are presented for accelerating the search for the optimal sample condition. The sample inspection device may have one chamber (FIGS. 2A-2C), multiple fluidically disconnected chambers (FIGS. 3A-3C and FIG. 4), or multiple fluidically connected chambers (FIG. 5A) formed between a top electron transparent layer and a bottom electron transparent layer. The samples with different sample conditions may be loaded into the one or more chambers and inspected by imaging through a window form by at least a portion of the electron transparent layers. Multiple pillars are arranged in the chamber. The window covers at least one of the pillars. Each pillar has one end bonded with the top electron transparent layer and the other end bonded with the bottom electron transparent layer. The sample may flow around the pillar. The pillars provide mechanical strength and robustness to the window. More importantly, by bonding the pillar with the electron transparent layers, bulging during sample loading and device vitrification may be prevented.

For the sample inspection device with disconnected chambers, discrete sample conditions may be imaged and analyzed. For the sample inspection device with fluidically connected chambers, a gradient of sample conditions may be formed in the mixing region, and continuous varied sample conditions may be imaged and analyzed. FIG. 5B shows example sample condition in the mixing region of the device in FIG. 5A. By providing a window covering multiple samples or samples with different sample conditions, multiple locations of the sample and/or multiple samples may be imaged with minimal translation of the imaging beam or the sample. Further, a large window area provides a large area with uniform thickness and heat capacity, which may facilitate building high quality ice during vitrification.

The inner surface of the sample inspection device may be pretreated to facilitate sample entry into the chamber. The inner surface may be pretreated during manufacturing the sample inspection device. The inner surface may alternatively or additionally be pretreated before loading the samples into the device.

FIGS. 2A-2C, 3A-3C, 4 and 5A show example configurations of the sample inspection device with relative positioning of the various components. These figures are not drawn to scale. If shown directly contacting each other, or directly coupled, then such elements may be referred to as directly contacting or directly coupled, respectively. Similarly, elements shown contiguous or adjacent to one another may be contiguous or adjacent to each other, respectively. As another example, elements positioned apart from each other with only a space there-between and no other components may be referred to as such, in at least one example. Further, as shown in the figures, a topmost element or point of element in the z axis may be referred to as a "top" of the component and a bottommost element or point of the element in the z axis may be referred to as a "bottom" of the component, in at least one example. As used herein, top/bottom, upper/lower, above/below, may be relative to the z-axis and used to describe positioning of elements of the figures relative to one another.

Figure 6:
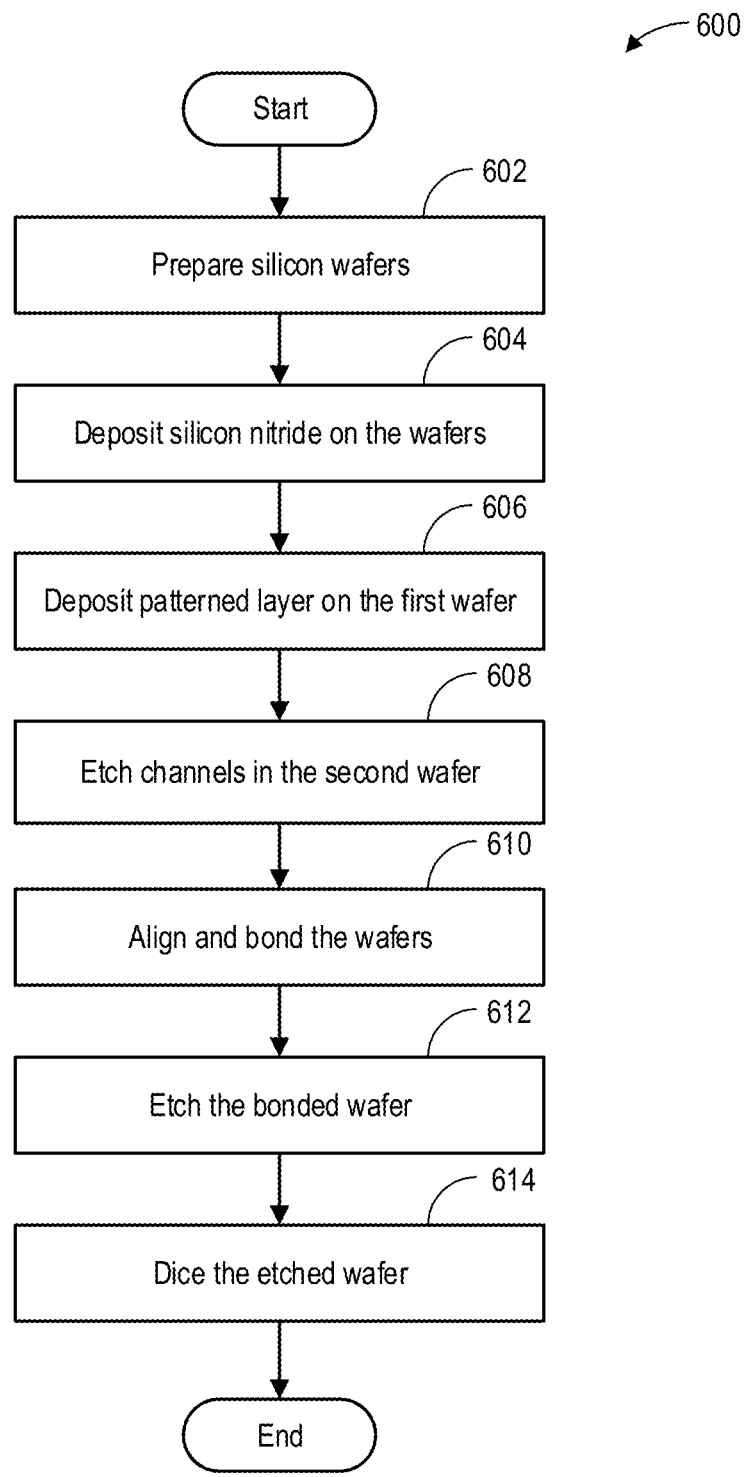
FIG. 6 is a method for manufacturing the sample inspection device.
Figure 7:
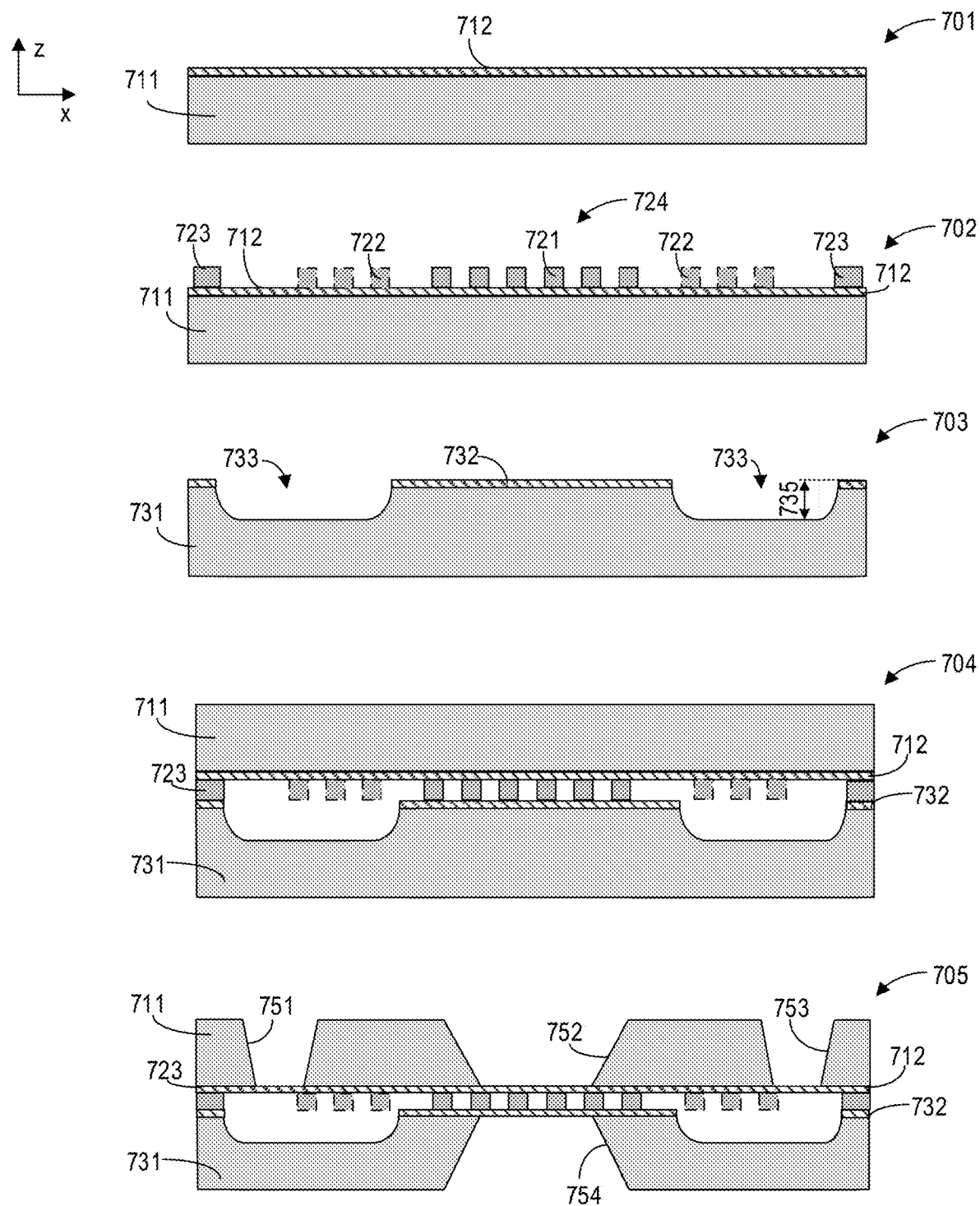
FIG. 7 illustrates procedures for manufacturing the sample inspection device, according to the method of FIG. 6.

FIG. 6 shows an example method for manufacturing the sample inspection device. FIG. 7 illustrates the procedures for manufacturing the sample inspection device according to the method of FIG. 6. The sample inspection device may be made from two silicon wafers each deposited with a layer of electron transparent material. The two deposited wafers are bonded together by a patterned layer. The patterned layer forms the multiple pillars and the bonding layer.

Figure 8:
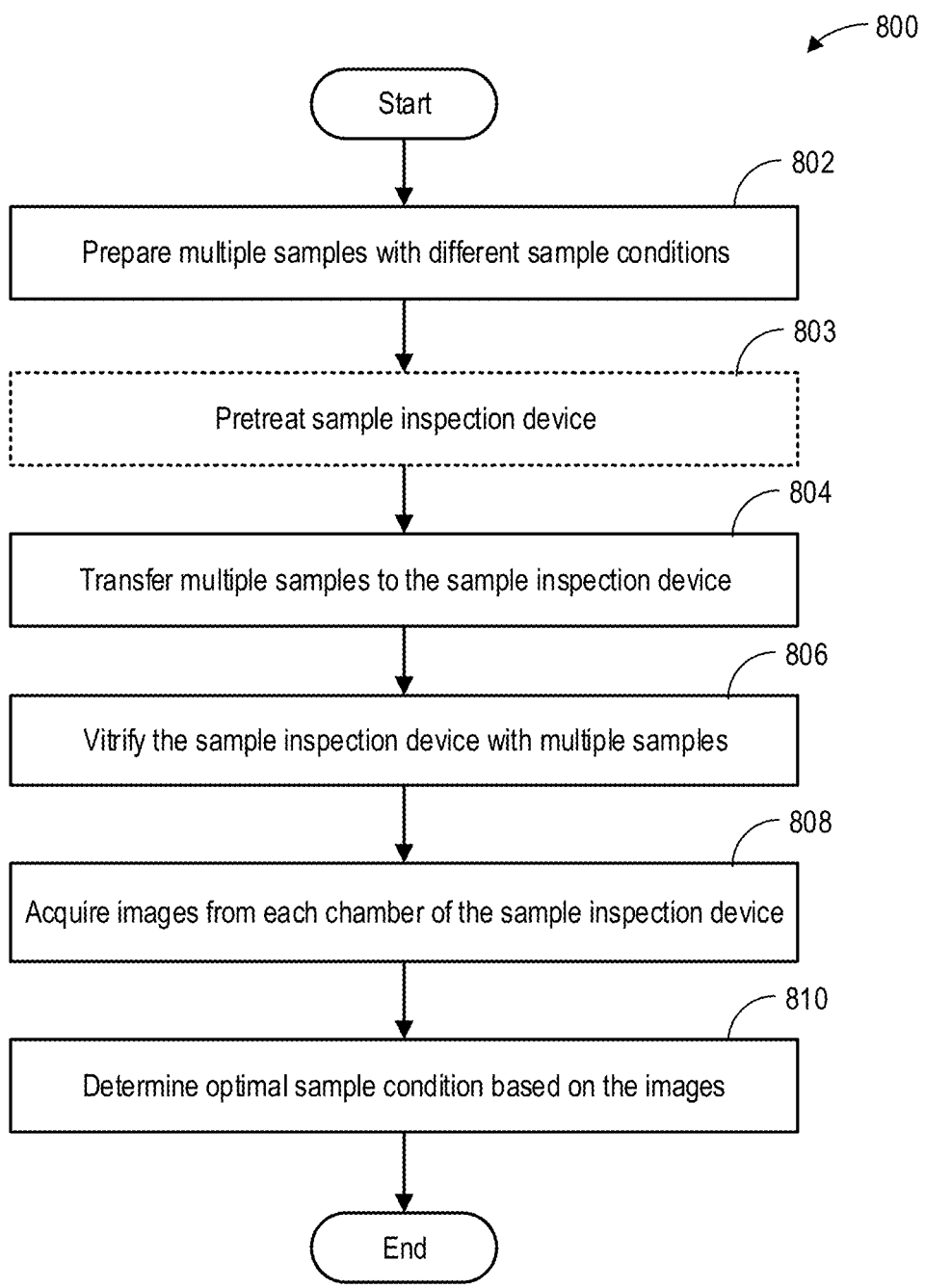
FIG. 8 shows an example method for screening sample condition using a sample inspection device with disconnected chambers.
Figure 9:
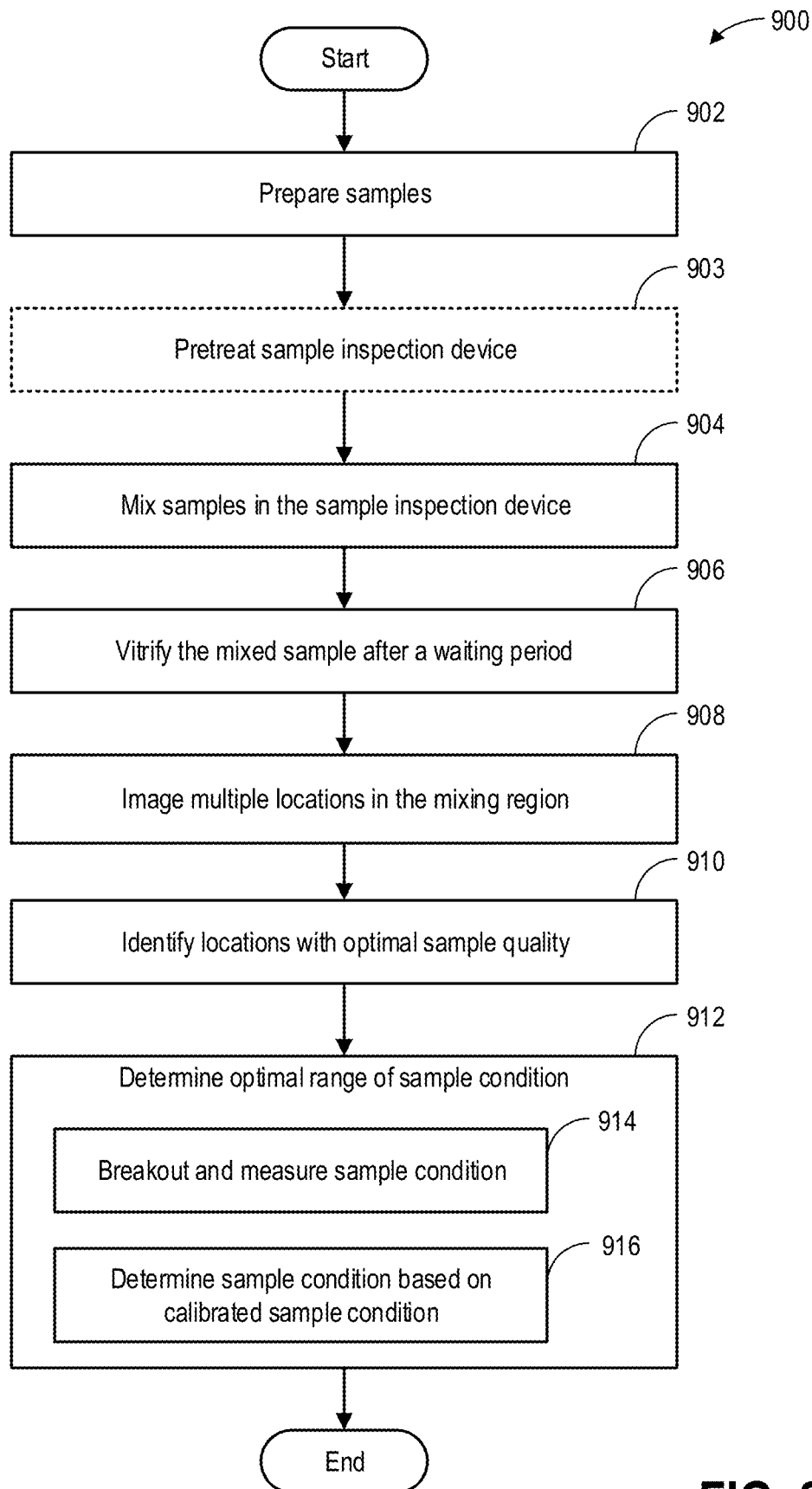
FIG. 9 shows an example method for screening sample condition using a sample inspection device with connected chamber.
Figure 10:
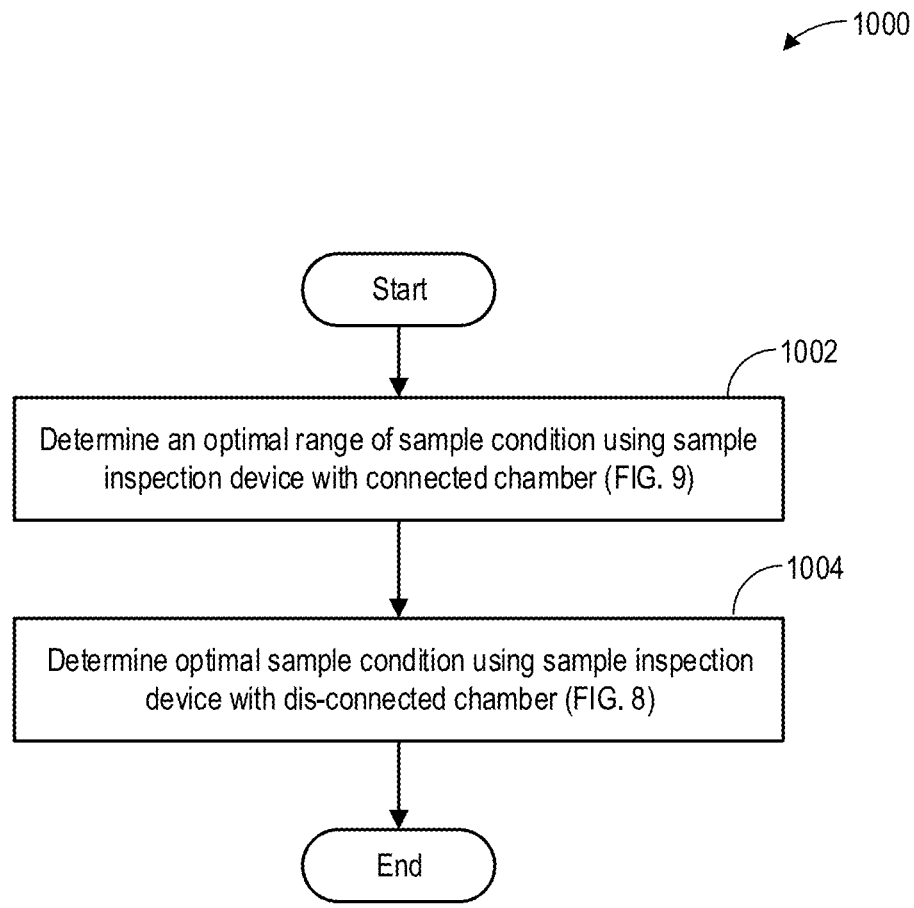
FIG. 10 shows an example method for screening sample condition using both a sample inspection device with disconnected chambers and a sample inspection device with connected chamber.

The sample inspection device with multiple disconnected chambers may be used individually for screening discrete sample conditions, as shown in FIG. 8. The sample inspection device with multiple connected chambers may be used for screening continuously varied sample conditions, as shown in FIG. 9. The sample inspection device with connected chambers can be used together with the sample inspection device with disconnected chambers for fast identifying the optimal sample condition, as shown in FIG. 10. The optimal range of sample condition may be first identified using the device with connected chamber. The optimal sample condition within the optimal range may then be identified using the device with disconnected chamber.

Turning to FIG. 1, a cryo-EM imaging system in accordance with an embodiment of the disclosure is shown. The cryo-EM system may include a transmission electron microscopy (TEM) system 100 for imaging vitrified samples. The TEM system 100 includes an electron source 10 that emits charged particles along emission axis 110, such as electron beam 11, towards a column 12. The electron source 10 may generate high energy electrons, that is, electrons having typical energies of between about 10 keV and 1,000 keV. In some embodiments, the column 12 may include one or more condenser lens, such as condenser lenses 120 and 121, and one or more aperture, such as aperture 122. Column 12 collimates electrons generated from electron source 10 and directs the electron beam onto sample inspection device 14. The sample inspection device 14 may be held by a sample holder 13. The sample inspection device may be any of the sample inspection devices described herein. The sample holder 13 may adjust sample position by tilting and/or translating the sample. The sample holder may be kept at temperatures well below zero degrees for cryogenic imaging. A condenser aperture 15 may be optionally inserted into the beam path to allow the electron beam to irradiate only a selected area of the sample.

The TEM system 100 may be used for acquiring both diffraction patterns and EM images of the sample. In the diffraction imaging mode, the scattered electrons may transmit through the sample inspection device 14 and be collected by detector 25 after travelling sequentially through objective lens 123, intermediate lens 126, and projector lens 127, as shown with the solid lines. The un-scattered beam may be blocked by beam stopper 17. The collected scattered electrons be used to form an electron diffraction pattern, such as a selected area electron diffraction (SAED) pattern. In the EM imaging mode, the beam stopper 17 is removed from the beam path. The electrons transmitted from the sample inspection device 14 travel sequentially through object lens 123, intermediate lens 126 and projector lens 127, and form a TEM image of the sample on detector 25, as shown with the dashed lines.

The detector 25 may detect the received electrons and send the signal to image processor 24 to form an image. The detector 25 may include an amplifier for amplifying the signal before sending the signal to the image processor 24. In one example, the detector 25 may be a CCD camera or a CMOS camera. In some embodiments, different detectors may be used for detecting signals generated by the interaction of the electrons with the sample. For example, the detector may detect x-rays and/or photons.

The controller 30 may control the operation of the TEM system 100, either manually in response to operator instructions or automatically in accordance with computer readable instructions stored in non-transitory memory (or computer readable medium) 32 of the controller 30. The controller 30 may include a processor 24 and be configured to execute the computer readable instructions stored in the memory 32 and control various components of the TEM system 100 in order to implement any of the methods described herein. For example, the controller may adjust the imaging mode to acquire the diffraction pattern or the EM image by adjusting the position of the selected area aperture 15 and the objective diaphragm 124. The controller 30 may adjust the dose of the electron beam irradiated towards the sample by adjusting current density. For example, the current density may be adjusted by adjusting the condenser optics (such as condenser lens 120 and 121). The controller 30 may adjust the profile of the incident beam by adjusting one or more apertures and/or lens in column 12. The controller 30 may adjust the sample position and/or orientation relative to the incident beam by adjusting the sample holder 13. The controller 30 may be configured to automatically acquiring images at one location or multiple locations of the sample inspection device 14. The controller 30 may further be coupled to a display 31 to display notifications and/or images of the sample. The controller 30 may receive user inputs from user input device 33. The user input device 33 may include keyboard, mouse, or touchscreen.

Though the TEM system is described by way of example, it should be understood that the diffraction pattern and the EM images may be acquired with other microscopy systems. As one example, the diffraction patterns may be acquired by optical based microscopy systems. As one example, the diffraction pattern may be X-ray diffraction pattern acquired from an X-ray diffraction system. As another example, the EM image may be acquired from a scanning transmission electron microscopy (STEM) system. The present discussion of TEM system is provided merely as an example of one suitable imaging modality.

Figure 2A:
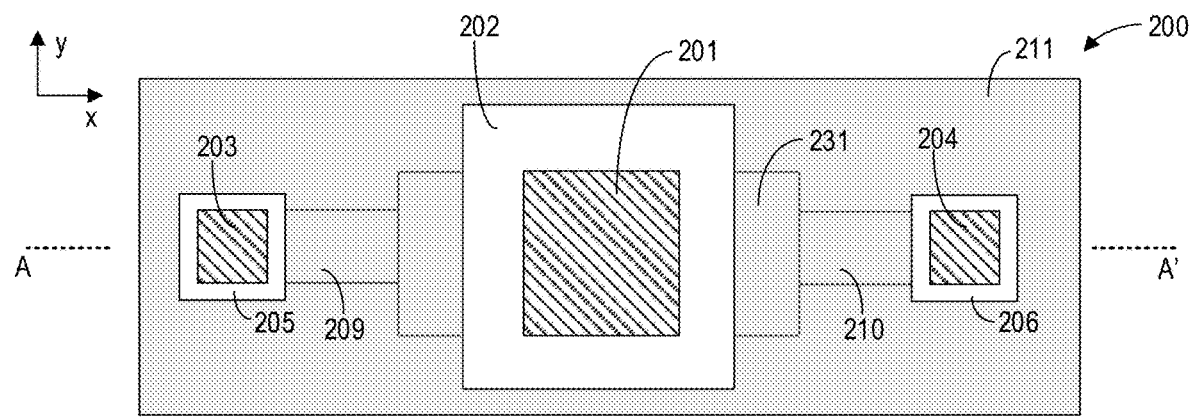
FIGS. 2A, 2B, and 2C show an example sample inspection device with one chamber.
Figure 2B:
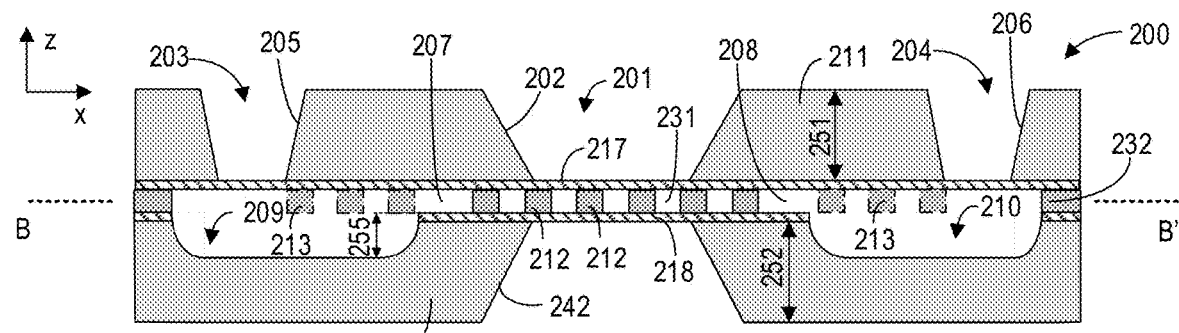
Figure 2C:
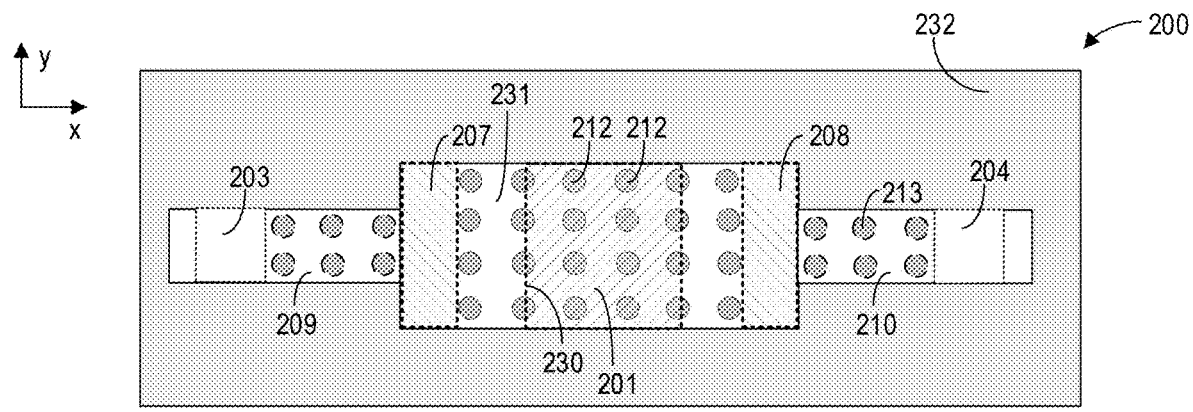

FIGS. 2A-2C show an example of the sample inspection device 200 with a single chamber. An inlet and an outlet are fluidically connected with the chamber. The sample may flow into the chamber via the inlet and be inspected through a window covering at least a portion of the chamber.

FIG. 2A is a top view of the sample inspection device 200. The sample inspection device 200 maybe rectangular. For example, the sample inspection device may be 10×3.3 mm². Window 201, inlet 203, and outlet 204 are formed in the top layer 211 of the sample inspection device. The window 201, inlet 203, and outlet 204 may be formed by creating tapered recesses 202, 205, and 206, respectively, in the top layer 211. The opening of the recesses (202, 205, and 206) in the x-y plane decreases as the opening approaching the chamber 231. The recesses (202, 205, and 206) have a depth the same as the thickness of the top layer 211. In one example, the recesses (202, 205, and 206) are created by etching a silicon wafer. The thickness of the top layer 211 may be 300 um. The minimal dimension of window 201 in the x-y plane may be larger than 100 um. A large window area provides a large area with uniform thickness and heat capacity, which may facilitate building high quality ice during vitrification. In one example, window 201 is square with a perimeter greater than 100 um. In another example, window 201 is square with a perimeter around 200 um. In other examples, window 201 may be other shapes such as rectangular or round. In one example, the inlet 203 and outlet 204 are square with a perimeter between 80-180 um. In other examples, inlet 203 and outlet 204 may be of other shapes, such as rectangular or round. The window 201 covers at least a portion of chamber 231. The inlet 203 and the outlet 204 are in fluid communication with chamber 231. A sample may flow into chamber 231 from inlet 203 via channel 209, and flow from chamber 231 to the outlet 204 via channel 210. The sample within the chamber may be inspected via window 201.

FIG. 2B is a cross-section view of the sample inspection device 200 in the x-z plane along A-A' of FIG. 2A. Two electron transparent layers 217 and 218 are positioned between top layer 211 and bottom layer 215. The top electron transparent layer 217 is in direct contact with the top layer 211, and the bottom electron transparent layer 218 is in direct contact with bottom layer 215. The top electron transparent layer 217 and the bottom electron transparent layer 218 are bonded by a bonding layer 232 and one or more pillars 212. The thickness of the electron transparent layers 217 and 218 may be 20 nm. A tapered recess 242 is formed in the bottom layer 215 and aligned with recess 202 so that charged particles, such as electrons, may transmit through the sample inspection device through window 201. Similar to recess 202, the opening of recess 242 in the x-y plane decreases as the opening approaching the chamber 231. The height of recess 242 is the same as the thickness 252 of the bottom layer 215. The thickness 251 of the top layer 211 may be the same as the thickness 252 of the bottom layer 215.

Window 201 includes a portion of at least one of the two electron transparent layers 217 and 218. The portion of the electron transparent layer 217 forming window 202 is of a continuously material. Chamber 231 is formed between the electron transparent layers 217 and 218. The distance between the two electron transparent layers (or the height of the chamber) may be 50-100 nm. Multiple pillars 212 are arranged between the two electron transparent layers 217 and 218, allowing sample flowing around the pillar. Each of pillar 212 extends from the top electron transparent layer 217 to the bottom electron transparent layer 218. Each of pillar 212 has one end bonded to the top electron transparent layer 217 and the other end bonded to the bottom electron transparent layer 218. By bonding each end of the pillar to one of the two electron transparent layers, the sample inspection device may retain the shape during the process of sample loading, sample vitrification, and sample imaging. In one example, the shape of the pillars in the x-y cross-section may be round, oval, or rectangular. Window 201 covers at least one of the pillars 212. The cross-section area of each pillar in the x-y plane may be 3 um²-350 um². The pillars (212, 213) and the bonding layer 232 may be manufactured in the same process step and out of the same material. Charged particles may transmit through the window 201 between the gaps of the pillars 212, so that the sample surrounding the pillars may be imaged. In other words, window 201 has at least a region allowing the charged particles to transmit through and at least a region where the charged particles are blocked by the pillar. By arranging pillars within the chamber covered by the window, the area of the window may be increased. Increased window area allows larger imaging area and reduces stage traveling distance while inspecting the sample with the charged particle imaging system. Further, large window area facilitates homogeneous sample cooling during vitrification. Moreover, the pillars provide mechanical support of the window and increase robustness of the sample inspection device.

Channels 209 and 210 are formed in the bottom layer 215 to connect inlet 203 and outlet 204 with chamber 231, respectively. The channels may be created by etching into the bottom layer 215. The height 255 of channels 209 and 210 may be 0.1-10 um. In some embodiments, multiple pillars 213 may optionally arranged in the chamber, with one end bonded to the top electron transparent layer 217. In one embodiment, the chamber 231 is evacuated. The inlet 203 and outlet 204 are hermetic sealed by a thin membrane. In one example, inlet 203 and outlet 204 are sealed by the top electron transparent layer 217, as shown in FIG. 2B. In another embodiment, the sample inspection device only has inlet but no outlet. The inlet may be hermetic sealed with a thin membrane. The sample may flow into the chamber by poking and breaking the thin membrane.

Buffering chambers 207 and 208 are arranged between inlet 203 and chamber 231, and between chamber 231 and outlet 204, respectively. The sample flows from the inlet to the region of the chamber 231 covered by window 201 via buffering chamber 207. In some embodiments, the buffering chamber may be a part of chamber 231, as shown in FIG. 2B-2C. The buffering chambers 207 and 208 are between the two electron transparent layers 217 and 218. No pillar is arranged in the buffering chamber. In other embodiments, the buffering chambers may be a part of channel 209 and 210. The pillar-free buffering chamber may avoid back-flow of the sample from chamber 231 towards inlet 203.

FIG. 2C is a cross-section view of the sample inspection device 200 in the x-y plane along B-B' of FIG. 2B. Part of chamber 231 is covered by window 201. The edge of the window is delineated by dashed line 230. Buffering chambers 207 and 208 fluidically connect the chamber region covered by the window with the inlet 203 and outlet 204, respectively. The window 201 covers multiple pillars 212. In other words, the window 201 is supported by multiple pillars 212. The sample may flow sequentially from the inlet 203 to the region of chamber 231 covered by window 201 via channel 209 and buffering chamber 207. If the sample inspection device includes an outlet 204, the sample may be drained from the region of chamber 231 covered by window 201 to the outlet via buffering chamber 208 and channel 210.

In some embodiments, the sample inspection device may be round. For example, the sample inspection device may be round with a diameter of 3 mm.

Figure 3A:
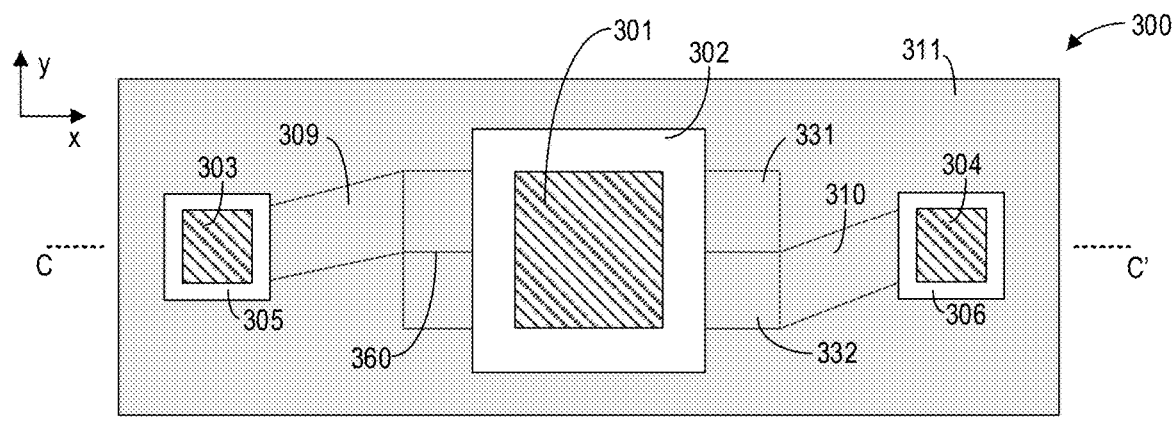
FIGS. 3A, 3B, and 3C show an example sample inspection device with two disconnected chambers.
Figure 3B:
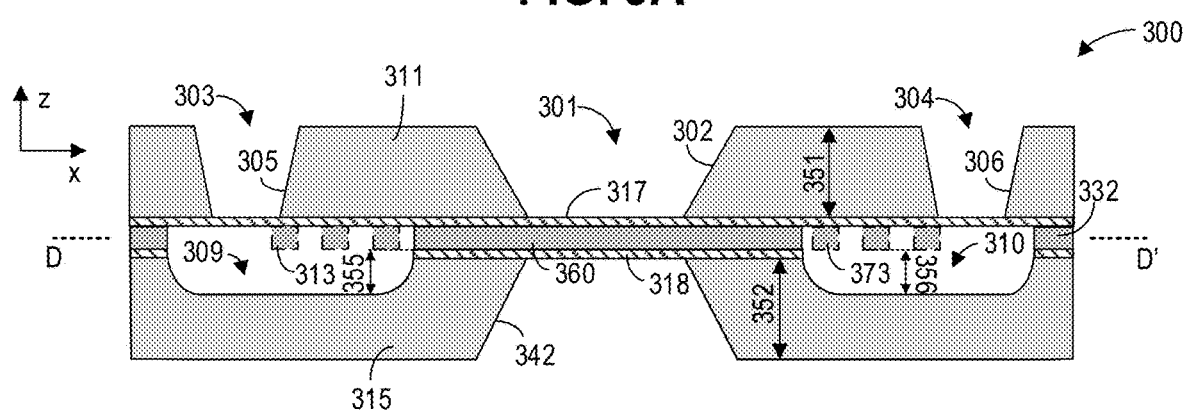
Figure 3C:
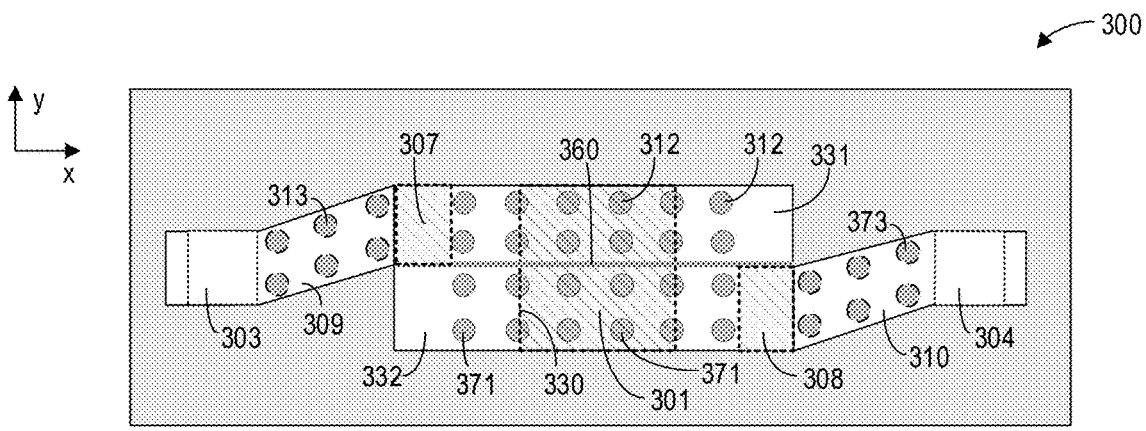

FIGS. 3A-3C show an example of the sample inspection device 300 with two disconnected chambers. Each chamber has an inlet fluidically connected with the chamber. In this example, the sample inspection device 300 does not include outlet. Samples in both chambers may be inspected via a window. In some examples, one or more of the chambers may be connected to one or more outlet.

FIG. 3A is a top view of the sample inspection device 300. Window 301, the first inlet 303, and the second inlet 304 are formed by creating tapered recesses 302, 305, and 306 in the top layer 311, respectively. Window 301 covers both a portion of the first chamber 331 and a portion of the second chamber 332. The first chamber 331 and second chamber 332 are not fluidically connected. Within the region covered by window 301, the first chamber 331 and second chamber 332 are separated by wall 360. The first inlet 303 is fluidically connected with the first chamber 331 by channel 309. The second inlet 304 is fluidically connected with the second chamber 332 by channel 310.

The thickness of the top layer 311 may be 300 um. The minimal dimension of window 301 in the x-y plane may be greater than 100 um. In one example, window 301 is square with a perimeter larger than 100 um. In another example, window 301 is square with a perimeter around 200 um. In other examples, window 301 may be of other shapes such as rectangular or round. In one example, inlet 303 and inlet 304 are square with a perimeter between 80-180 um. In other examples, inlet 303 and inlet 304 may be of other shapes, such as rectangular or round.

FIG. 3B is a cross-section view of the sample inspection device 300 in the x-z plane along C-C' of FIG. 3A. Two electron transparent layers 317 and 318 are positioned between top layer 311 and bottom layer 315. The top electron transparent layer 317 is in direct contact with the top layer 311, and the bottom electron transparent layer 318 is in direct contact with bottom layer 315. The top electron transparent layer 317 and the bottom electron transparent layer 318 are bonded by the bonding layer 311 and pillars 312. The pillars (312, 313, and 373) and the bonding layer 311 may be manufactured in the same process step and out of the same material. The thickness of the electron transparent layers 317 and 318 may be 20 nm. The openings of the tapered recesses 305, 302, and 306 decreases and the opening approaching the top electron transparent layer 317. The depths of the tapered recesses are the same as the thickness 351 of the top layer 311.

A tapered recess 342 is formed in the bottom layer 315 and aligned with recess 302 so that charged particles, such as electrons, may transmit through the sample inspection device through window 301. The opening of recess 342 in the x-y plane decreases as the opening approaching the bottom electron transparent layer 318. The height of recess 342 is the same as the thickness 352 of the bottom layer 315. The thickness 351 of the top layer 211 may be the same as the thickness 352 of the bottom layer 315.

Channels 309 and 310 are formed in the bottom layer 315 to connect the first inlet 303 with the first chamber 331, and to connect the second inlet 304 with the second chamber 332, respectively. The channels may be created by etching into the bottom layer 315. The height 355 of channel 309 and the height 356 of channel 310 may be 0.1-10 um. Pillars 313 and 373 may optionally be positioned in the channel 309 and/or channel 310. The pillars 313 and 373 may bond to the top electron transparent layer 317. In some embodiments, the first inlet 303 and the second inlet 304 are hermetic sealed by a thin membrane from the first chamber 331 and the second chamber 332, respectively. In one example, the thin membrane is formed by the top electron transparent layer 317, as shown in FIG. 3B. The first chamber 331 and the second chamber 332 may be evacuated. The liquid sample may flow into the chamber by poking or breaking the thin membrane.

FIG. 3C is a cross-section view of the sample inspection device 300 in the x-y plane along D-D' of FIG. 3B. Window 301 covers both a portion of the first chamber 331 and a portion of the second chamber 332. The edge of the window is delineated by dashed line 330. Buffering chamber 307 fluidically connects the region of the first chamber covered by the window 301 with the inlet 303. Buffering chamber 308 fluidically connects the region of the second chamber covered by the window 301 with the inlet 304. The window 301 covers multiple pillars 312. In other words, the window 301 is supported by multiple pillars 312. A first sample may flow sequentially from the first inlet 303 to the region of chamber 331 covered by window 301 via channel 309 and buffering chamber 307. A second sample may flow sequentially from the second inlet 304 to the region of chamber 332 covered by window 301 via channel 310 and buffering chamber 308.

Figure 4:
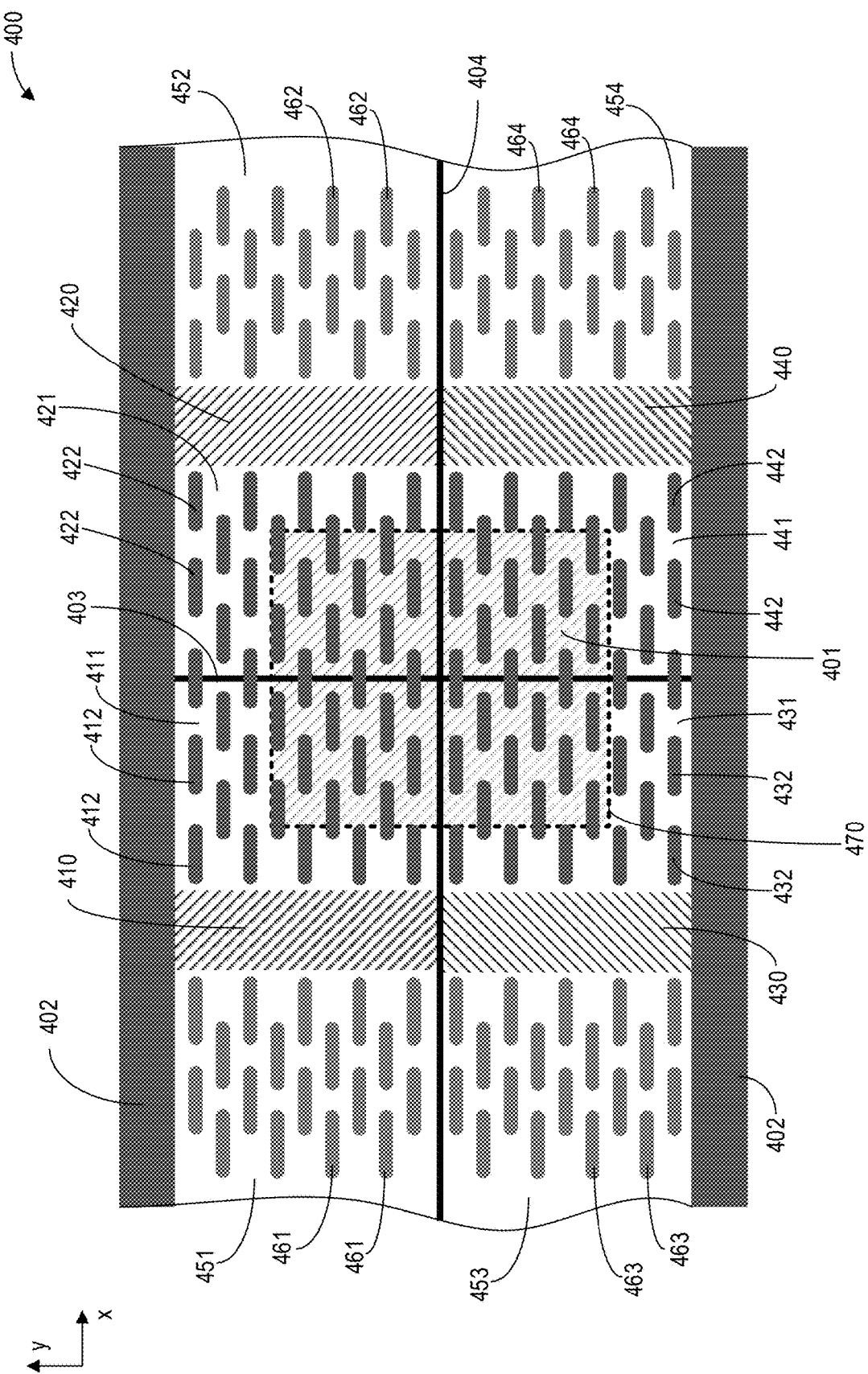
FIG. 4 shows an example sample inspection device with four disconnected chambers.

FIG. 4 is a cross-section view of a part of a sample inspection device 400 with four disconnected chambers 451, 452, 453 and 454 formed between two electron transparent layers bonded by bonding layer 402. A window 401 covers at least a portion of each chamber.

The edge 470 of the window is delineated with dashed line. The region covered by window 401 in the x-y plane is indicated by diagonal lines within the window edge 470. Window 401 includes at least a portion of a continuous top electron transparent layer. The minimal dimension of window 401 in the x-y plane may be greater than 100 um. The sample inspection device may not have outlet, and the inlets are sealed by a thin film, similar to the sample inspection device of FIGS. 3A-3C. Four different samples may be transferred to different chambers of the sample inspection device and imaged through the window 401.

The first chamber 411 and the third chamber 431 are separated from the second chamber 421 and the fourth chamber 441 by wall 403. The first chamber 411 and the second chamber 421 are separated from the third chamber 431 and the fourth chamber 441 by wall 404. Each chamber may include a region arranged with multiple pillars and a region without pillars. The region without pillars is also referred herein as buffering chamber. For example, the first chamber 411 includes a region arranged with multiple pillars 412 and pillar-free buffering chamber 410. The second chamber 421 includes a region arranged with multiple pillars 422 and pillar-free buffering chamber 420. The third chamber 431 includes a region arranged with multiple pillars 432 and pillar-free buffering chamber 430. The fourth chamber 441 includes a region arranged with multiple pillars 442 and pillar-free buffering chamber 440. Window 401 covers at least one pillar in each of the chambers. In other words, the entirety of at least one pillar in the x-y plane is covered by window 401 in the x-y plane. Herein, the pillars are shown in stadium shape in the x-y plane. The cross-section of the pillar may be in other shapes, such as rectangle or round. In some embodiments, the pillars may be in different shapes in one sample inspection device.

Each of the chambers is in fluidical connection with a different inlet (not shown) via a channel (451, 452, 453, or 454). Multiple pillars (461, 462, 463, and 464) may optionally be arranged within the channel.

In one embodiment, the buffering chamber may be included in the channel instead of the chamber. In some embodiment, the number of chambers of the sample inspection device may be any integer number, such as 16, 32, or 64.

Figure 5A:
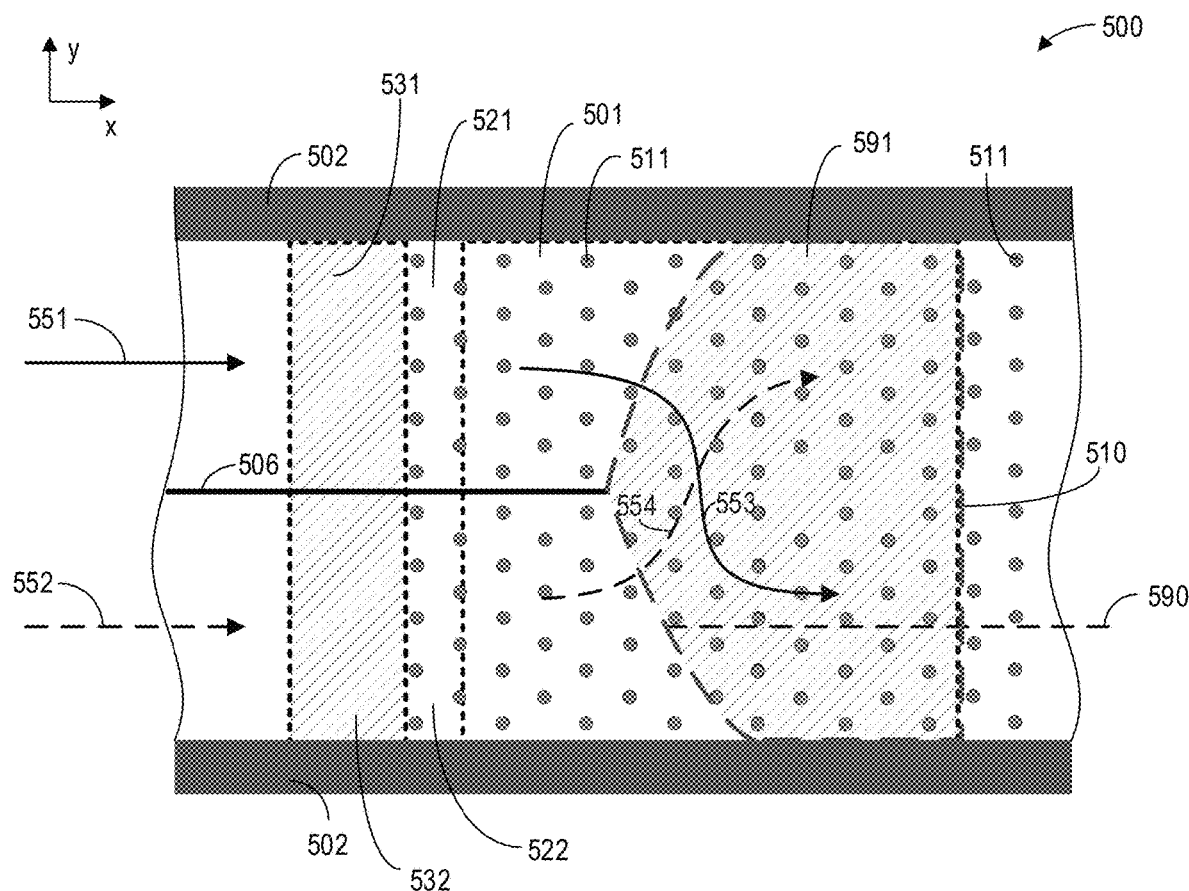
FIG. 5A shows an example sample inspection device with two connected chambers.
Figure 5B:
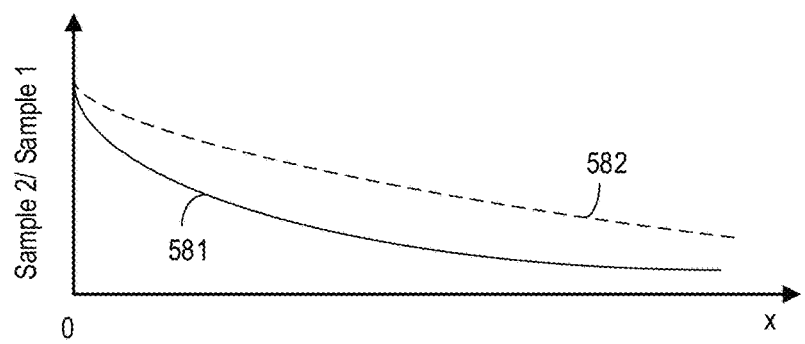
FIG. 5B shows varied sample condition distribution in the sample inspection device of FIG. 5A.

FIG. 5A is a cross-sectional view of a part of an example sample inspection device 500. The sample inspection device 500 includes connected chambers formed between two electron transparent layers bonded by bonding layer 502. The first chamber 521 and the second chamber 522 receive the first sample and the second sample from different inlets (not shown), as indicated by arrow 551 and 522, respectively. The first chamber 521 and the second chamber 522 are fluidically separated upstream (that is, a direction opposite to x-axis arrow direction) of the device by wall 506 and are fluidically connected downstream of the device. The first sample and the second sample are mixed downstream (that is, arrow direction of x-axis) in mixing region 591 of the sample inspection device. The flow direction of portions of the first sample and the second sample are as indicated by arrows 553 and 554, respectively.

The first sample, the second sample, and the mixture of the samples may be inspected through a window formed by at least a portion of the two electron transparent layers. The window covers region 501 in the x-y plane. The region 501 is covered by a continuous portion of an electron transparent layer (such as the top electron transparent layer). Dashed line 510 delineates the edge of the window covered region 501. The window covered region 501 includes the mixing region 591, where the samples are mixed. The window may also cover a part of wall 506. The window covered region 501 includes at least one pillar of multiple pillars 511 arranged between the two electron transparent layers. Herein, the pillars 511 are round in the x-y plane. In other examples, the cross-section of pillars 511 may be other shapes, such as stadium or rectangular.

Each chamber (521 and 522) of the sample inspection device 500 may include a pillar-free buffering chamber (531 and 532) upstream of the region of window covered region 501. In some embodiments, the sample inspection device may include more than two connected chambers for mixing more than two samples. The window may cover the region where the samples are mixed.

The first sample and the second sample may be transferred to the sample inspection device simultaneously. From the moment of transferring the samples to the sample inspection device, a laminar, stationary flow may be established for each sample. Sample mixing occurs at the interface of these two parallel flows in the mixing region. Gradient of sample conditions may form in the mixing region. In one example, if the stationary sample flow remains from transferring the sample to the sample inspection device to the time of vitrification, the sample condition is a function of the sample position in the mixing region. In another example, the sample condition may be a function of the sample position as well as a waiting period from transferring the sample to the time of vitrification. Different sample conditions, such as sample ratios, may be observed at different locations of the mixing region at different time point. The spatial distribution of the sample ratio in the mixing region 591 changes over time.

FIG. 5B shows the ratio between sample 2 and sample 1 along line 590 across the mixing region 591 of FIG. 5A. In one example, if both samples maintain laminar and stationary flow from transferring the samples to the sample inspection device to the time of vitrification, the sample ratio 581 does not change with time. The sample ratio 581 decreases as the distance in the x-axis from the end of wall 506 increases. In another example, after transferring samples into the sample inspection device at T1, the sample ratio 581 changes with time. For example, at time T2, later than time T1, the sample ratio 582 increases from sample ratio 581 at T1.

The sample inspection devices shown in FIGS. 2A-2C, 3A-3C, 4 and 5A include one or more chambers covered by a single window. The single window includes a part of a continuous electron transparent layer. The window covers and is supported by at least one pillar bonded between the two electron transparent layers. The pillar may have a cross-section of a single shape or multiple shapes. In some examples, all or a portion of the inner surface (that is, surface in direct contact with the sample during sample loading and imaging) of the sample inspection device may be pretreated to facilitate sample loading. The pretreatment may be done at room temperature.

The surface pretreatment can be done via different experimental approaches. In one example, the surface may be pretreated by surface activation method at room temperature. The inner surface of the sample inspection device may be treated with chemical solutions to enable proper surface wetting, facilitate sample entry into the device, and facilitate adhesion of the sample into chamber. The surface of the sample inspection device may be treated by incubating the solution on the surface or flowing the solution through the surface. For example, a buffer with optimum concentration of detergent or a hydrophilic anti-fouling compound, such as PEG that doesn't interfere with structure and functionality of target protein, may be flown through the sample inspection device before transferring or loading the sample into the device to modify the inner surface of the device. In some examples, the chemicals may covalently bind to the inner surface of the device.

In another example, the inner surface of the sample inspection device may be treated by plasma cleaning. For example, charged air is applied in high voltage via radical reaction to increase the hydrophilicity of the surface.

In yet another example, the inner surface of the sample inspection device may be pretreated by irradiating the inner surface with radiation, such ultraviolet light irradiation (UV). The inner surface is exposed to UV light to alter the surface tension and surface free energy which increase the wettability of surface.

FIG. 6 is an example method 600 for manufacturing the sample inspection device. FIG. 7 illustrates the procedures of method 600 for manufacturing the sample inspection device in FIGS. 2A-2C.

At 602, two silicon wafers are prepared. In one example, the diameter of each wafer in the x-y plane may be 4 inches. The thickness of the wafers may be 300 um.

At 604, a layer of silicon nitride is deposited on one surface of each wafer. The thickness of the silicon nitride layer may be 20 nm. In one example, the silicon nitride layer is deposited by low-pressure chemical vapor deposition (LPCVD). Plot 701 of FIG. 7 shows a x-z cross-section of the first wafer 711 deposited with the electron transparent silicon nitride layer 712.

At 606, a patterned layer is deposited over the silicon nitride layer of the first wafer. The thickness of the patterned layer may be 50-100 nm. The patterned layer may be borophosphosilicate glass (BPSG). In one example, the patterned layer is deposited by plasma-enhanced vapor deposition (PECVD). Plot 702 of FIG. 7 shows the patterned layer 724 deposited over the silicon nitride layer 712. The patterned layer 724 may form one or more of the pillars 721 within in the chamber (such as chamber 231 of FIGS. 2A-2C), pillars 722 in the channel (such as channel 209 of FIGS. 2A-2C), and bonding layer (such as bonding layer 232 of FIGS. 2A-2C).

At 608, channels are etched in the second wafer. The channels may be formed by etching through the silicon nitride layer deposited on the second wafer. The depth of the channel may be 0.1-10 um. Plot 703 shows channels 733 etched into second wafer 731 deposited with silicon nitride layer 732. The depth 735 of the channels 733 may be 0.1-10 um.

At 610, the first wafer from step 606 and the second wafer from step 608 may be aligned and bonded in vacuum or low-pressure of inert gas by direct or fusion bonding. Plot 704 shows the processed first wafer of plot 702 and the processed second wafer of plot 703 aligned and bonded together.

At 612, the bonded wafer is etched. The bonded wafer may be etched to expose the silicon nitride layer. Plot 705 of FIG. 7 shows recesses 751, 752, 753 and 754 being etched to the bonded wafer to expose the silicon nitride layer 712 and 732. As such, one or more of the window, the inlet, and the outlet may be formed on the bonded wafer.

At 614, the etched wafer may be diced into multiple individual devices.

The inner surface of the sample inspection device may be pretreated. In one example, the inner surface of the sample inspection device may be pretreated before aligning and bonding the wafers at step 610. The inner surface may be irradiated with radiation, plasma cleaning, or heating. The inner surface may be pretreated by immersing a part or all of the inner surface of the device sequentially in one or more chemical solutions. The inner surface may be pretreated by sequentially flowing the solutions over the inner surface. The solutions may be a buffer with optimum concentration of detergent or anti-fouling chemicals such as PEG. In another example, the inner surface of the sample inspection device may be pretreated by heating the device after etching the bounded wafer at step 612. In yet another example, the inner surface may be pretreated by flowing the solutions through the device after aligning and bonding the wafers at step 610.

FIG. 8 shows method 800 for screening sample condition of multiple samples using the sample inspection device with disconnected chambers, such as the sample inspection devices of FIGS. 3A-3C and FIG. 4. Samples with different sample conditions may be transferred to different chambers of the sample inspection device and imaged. The optimal sample condition may be selected based on the cryo-EM images of the samples.

At 802, multiple samples with different sample conditions are prepared. For example, a purified protein solution may be mixed with multiple buffer solutions to obtain samples with different sample conditions. The samples may have different protein-to-buffer ratios, different protein concentrations, or different buffer concentrations.

At 803, the sample inspection device may optionally be pretreated before transferring or loading the samples into the device. The sample inspection device may be pretreated by plasma cleaning or flowing solutions through the device. For example, a buffer with optimum concentration of detergent or anti-fouling chemicals such as PEG may be flown through the inspection device sequentially before transferring the sample into the device to modify the inner surface. In some examples, if the inlet and/or outlet of the sample inspection device is sealed. The seal is first broken before pretreating the sample inspection device.

At 804, each sample of the prepared samples is transferred to one chamber of the sample inspection device. The samples may be transferred to the sample inspection device simultaneously or sequentially. For example, a small amount of a sample may be placed in the recess of the inlet of the sample inspection device. Then, the thin film sealing the inlet is poked and broken so that the small amount of the sample may flow in and fill the portion of the chamber covered by the window.

At 806, the samples transferred to the sample inspection device are vitrified. For example, the sample inspection device loaded with the multiple samples may be vitrified by plunge freezing.

At 808, sample images are acquired from each chamber of the sample inspection device, for example, using the cryo-EM imaging system of FIG. 1. To image the sample in a chamber, a charged particle beam may be directed to a location on the window, and towards the sample surrounding one of the pillars covered by the window. The image of the sample may be formed based on charged particles transmitted through the sample inspection device. Multiple images of a sample at different locations of the chamber may be taken, wherein the sample at different locations has the same sample condition.

At 810, the optimal sample condition that provides the best sample quality may be determined based on the sample images acquired from each chamber. The sample quality of each sample may be evaluated based on the images of each sample acquired at 808. The optimal sample condition corresponds to the best sample quality may be identified and used for sample preparation in the single particle analysis.

In this way, samples with different sample conditions may be vitrified, and imaged in a single device. Discrete sample conditions may be evaluated. In some examples, instead of loading the device chambers with one type of protein with different sample conditions, multiple samples with a variety of constructs may be loaded into multiple chambers of the one sample inspection device to determine the optimal stabilization method for the protein. In other examples, different protein complexes of a target protein with a variety of ligand or compounds may be loaded and inspected using one sample inspection device. In some examples, different proteins or multiple versions of a protein complex in different states (such as open/close or rotary) may be loaded and inspected using one sample inspection device.

FIG. 9 shows method 900 for screening sample condition of multiple samples using the sample inspection device with connected chambers, such as the sample inspection device of FIG. 5. The samples are transferred to the sample inspection device and mixed in the device. Images may be taken at different locations of a mixing region covered by the window of the sample inspection device. The optimal range of sample condition may be determined based on the images and the corresponding imaging location.

At 902, multiple samples are prepared. For example, a first sample is a purified protein solution, and the second sample is a buffer.

At 903, the sample inspection device may optionally be pretreated before transferring or loading samples into the device. The sample inspection device may be treated by plasma cleaning or flowing solutions through the device. For example, a buffer with optimum concentration of detergent or anti-fouling chemicals such as PEG may be flown sequentially through the inspection device before transferring the sample into the device to modify the inner surface.

At 904, the samples are mixed in the sample inspection device with connected chambers. Mixing the sample includes transferring the sample to the sample inspection device by flowing each sample into one inlet of the device. For example, a small amount of a sample may be placed in the recess of the inlet of the sample inspection device. Then, the thin film sealing the inlet is broken so that the small amount of the sample may flow into the region of chamber covered by the window. The samples may be flown into the device simultaneously, and mixed downstream of the device in the mixing region covered by the window.

At 906, the sample within the sample inspection device is vitrified after a waiting period from flowing the samples into the sample inspection device. The waiting period may be predetermined. The spatial distribution of sample condition in the mixing region may change with the waiting time. The sample in the sample inspection device may be vitrified by plunge freezing.

At 908, sample images are acquired from multiple locations in the mixing region of the sample inspection device, for example using the cryo-EM imaging system of FIG. 1. Each location in the mixing region may have a different sample condition. In one example, the images may be taken at predetermined locations.

At 910, the sample quality of the acquired sample images is evaluated, and locations where the images have good sample qualities may be identified.

At 912, the optimal range of sample condition is determined. Determining the optimal range of sample condition may include determining the sample conditions at the identified locations from 910. In some examples, the sensitivity of a sample condition may be determined by identifying the differences among multiple locations based on images from 908. Based on the sample conditions at the identified locations, an optimal range of sample condition may be determined.

In one example, at 914, the sample condition at each of the identified locations may be determined experimentally. The mixed sample at each identified location may be extracted and analyzed to obtain the sample condition. For example, the mixed sample may be extracted by breakout the sample inspection device using a focused ion-beam system.

In another example, at 916, the sample condition may be determined based on the identified locations and a calibrated sample condition distribution. The calibrated sample condition distribution may be generated theoretically via simulation based on parameters including one or more of the properties of the samples, the waiting time, temperature, and flow rate of the sample when transferring the sample to the sample inspection device. Alternatively, the calibrated sample condition distribution may be generated experimentally by measuring the sample condition of calibration samples in the sample inspection device.

In this way, the samples may be mixed, vitrified, and imaged in a single device. A continuous range of sample conditions of mixed samples may be obtained and evaluated.

FIG. 10 shows method 1000 for screening sample condition using both the sample inspection device with connected chamber and the sample inspection device with disconnected chamber. The optimal range of sample condition may be first determined by screening a large variation of sample conditions using the sample inspection device with connected chamber. Then, multiple samples with sample conditions within the optimal range may be screened individually to determine optimum sample condition using the sample inspection device with disconnected chamber.

At 1002, the optimal range of the sample condition is determined using method 900 of FIG. 9. For example, a protein solution and one or more buffers may be transferred to the sample inspection device with connected chambers. Based on the cryo-EM images, sample conditions that may result in the optimal sample quality are determined. Because a wide range of sample conditions may be obtained using the sample inspection device with connected chambers, buffer screening using method 900 provides a global search of the optimal range. However, due to continuous variation in spatial distribution of sample conditions in the mixing region, the sample condition within each sample image may vary. Further, limited number of the mixed sample at a particular sample condition can be imaged. As such, method 900 may provide an optimal range of sample condition that includes the optimum sample condition, but not specific optimum sample condition.

At 1004, multiple samples with sample conditions within the optimal range determined at 1002 are prepared. The samples may be screened using method 800 of FIG. 8 to determine the optimum sample condition within the optimal range. Multiple images of the sample with a particular sample condition may be obtained, wherein each image may be taken at a different location of the chamber. As such, the sample quality may be accurately and reliably evaluated.

In some embodiments, each of the step 1002 and 1004 may be repeated for screening different buffers and/or accurately identifying the optimum sample condition.

In this way, a global sample condition screening is first performed using the sample inspection device with connected chambers to identify the optimal range. A localized sample condition screening is performed within the optimal range to identify the optimum condition. The multiscale screening strategy may significantly reduce the sample condition screening time and facilitate locating the global optimum sample condition for single particle analysis.

The technical effect of providing a window covering at least one pillar of multiple pillars for sample inspection is to provide mechanical strength of the window covered area of the sample inspection device. The technical effect of bonding the pillar to the two electron transparent layers is to prevent bulging during sample loading and vitrification. The technical effect of imaging multiple samples within a chamber is that sample qualities may be better controlled for vitrification and the imaging. The technical effect of mixing multiple samples in the sample inspection device is that a continuous distribution of sample condition may be obtained. The technical effect of controlling the waiting time between flowing the sample into the sample inspection device and the sample vitrification is that the distribution of sample condition in the mixing region may be adjusted.

What is claimed is:

1. A sample inspection device, comprising:
   a first chamber formed between a top electron transparent layer and a bottom electron transparent layer for holding a first sample;
   a second chamber formed between the top electron transparent layer and the bottom electron transparent layer for holding a second sample, and wherein the window covers a portion of the second chamber for inspecting the second sample in the second chamber;
   multiple pillars within the first chamber, each pillar of the multiple pillars extends from the top electron transparent layer to the bottom electron transparent layer; and
   a window formed with a portion of at least one of the top electron transparent layer and the bottom electron transparent layer for inspecting the first sample in the first chamber, the window covering at least one of the multiple pillars.

2. The sample inspection device of claim 1, wherein the window allows inspecting the first sample surrounding the at least one of the multiple pillars covered by the window.

3. The sample inspection device of claim 1, wherein the multiple pillars are arranged between the top electron transparent layer and the bottom electron transparent layer in the second chamber.

4. The sample inspection device of claim 1, wherein the first chamber and the second chamber are fluidically connected in a region covered by the window.

5. The sample inspection device of claim 1, wherein one end of each pillar of the multiple pillars is bonded to the top electron transparent layer and the other end of the pillar is bonded to the bottom electron transparent layer.

6. The sample inspection device of claim 1, further comprising an inlet and a buffering chamber, wherein the inlet is fluidically connected to the first chamber via the buffering chamber, and no pillar is arranged in the buffering chamber.

7. The sample inspection device of claim 1, wherein at least a portion of the top electron transparent layer and/or the bottom electron transparent layer in contact with the first sample is pretreated to facilitate transferring the first sample into the first chamber.

8. The sample inspection device of claim 1, wherein a region of the window not covering the at least one of the multiple pillars allows a charged particle beam transmitting through the sample inspection device.

9. The sample inspection device of claim 1, wherein a distance between the two electron transparent layers is less than 100 nm.

10. A method of inspecting a sample using a sample inspection device, comprising:
    flowing a first sample into a first chamber of the sample inspection device, wherein the first chamber is formed between a top electron transparent layer and a bottom electron transparent layer, multiple pillars are arranged with in the first chamber, and each pillar of the multiple pillars extends from the top electron transparent layer to the bottom electron transparent layer;
    vitrifying the first sample in the sample inspection device after flowing the first sample into the first chamber;
    directing a charged particle beam towards a window of the sample inspection device after vitrifying the first sample in the sample inspection device, wherein the window is formed with a portion of at least one of the top electron transparent layer and the bottom electron transparent layer, and the window covers at least one of the multiple pillars; and
    forming a first image of the first sample based on charged particles transmitted through the sample inspection device.

11. The method of claim 10, further comprising treating an inner surface of the inspection device before flowing the first sample into the first chamber.

12. The method of claim 10, wherein directing the charged particle beam towards the window includes directing the beam to a location of the window not covering the at least one of the multiple pillars.

13. The method of claim 10, wherein directing the charged particle beam towards the window of the sample inspection device and forming the first image of the first sample based on the charged particles transmitted through the sample inspection device includes: directing the charged particle beam at a first location of the first chamber, and forming the first image of the first sample based on the charged particles transmitted through the sample inspection device.

14. The method of claim 13, further comprising:
    flowing a second sample into a second chamber of the sample inspection device, the second chamber formed between the top electron transparent layer and the bottom electron transparent layer, the second chamber fluidically separated from the first chamber, the window covering at least a portion of the second chamber;
    directing the charged particle beam towards a second location in the second chamber; and
    forming a second image of the second sample based on charged particles transmitted through the sample inspection device.

15. The method of claim 14, wherein the first sample and the second sample have different sample conditions, and the method further comprising determining an optimal sample condition by comparing the first image and the second image.

16. The method of claim 10, further comprising:
while flowing the first sample into the first chamber, flowing a second sample into a second chamber formed between the top electron transparent layer and the bottom electron transparent layer, and mixing the first sample and the second sample in a mixing region of the sample inspection device covered by the window; and
wherein directing the charged particle beam towards the window includes directing the charged particle beam at multiple locations within the mixing region, wherein ratios between the first sample and the second sample at the multiple locations are different.

17. The method of claim 16, wherein forming the image based on charged particles transmitted through the sample inspection device includes forming an image of each of the multiple locations based on charged the particles transmitted through the sample inspection device; and the method further comprising comparing the multiple images to determine an optimal sample condition.

18. The method of claim 16, further comprising vitrifying the first sample, the second sample, and the mixture of the first sample and the second sample in the sample inspection device before directing the charged particle beam towards the window; and determining the ratios between the first sample and the second sample at the multiple locations based on a duration between flowing the first sample and the second sample into the sample inspection device and the vitrification.

\* \* \* \* \*